United States Patent [19]

Mok

[11] 4,135,133

[45] Jan. 16, 1979

[54] DUAL MODE FILTER

[75] Inventor: Chuck K. Mok, Pincourt, Canada

[73] Assignee: RCA Corporation, New York, N.Y.

[21] Appl. No.: 797,404

[22] Filed: May 16, 1977

[51] Int. Cl.[2] .......................... H03H 9/00; H01P 7/06; H01P 1/00

[52] U.S. Cl. ............................... 333/73 W; 333/83 A; 333/98 R

[58] Field of Search ........... 333/8, 73 C, 73 W, 73 R, 333/73 S, 83 A, 83 T, 83 R, 98 R

[56] References Cited

U.S. PATENT DOCUMENTS

| | | | |
|---|---|---|---|
| 2,633,492 | 3/1953 | Ring | 333/73 W |
| 2,694,168 | 11/1954 | Kinzer et al. | 333/73 W |
| 2,950,452 | 8/1960 | Marcatili | 333/9 |
| 3,153,208 | 10/1964 | Riblet | 333/73 W |
| 3,516,030 | 6/1970 | Brumbelow | 333/73 R |
| 3,697,898 | 10/1972 | Blachier et al. | 333/73 W |

*Primary Examiner*—Alfred E. Smith
*Assistant Examiner*—Harry E. Barlow
*Attorney, Agent, or Firm*—H. Christoffersen; Joseph D. Lazar

[57] ABSTRACT

A dual mode filter, known in the art as a fourth order filter, has cylindrical coaxial input and output cavities that are connected through a coupling obstacle. The output of the dual mode filter is provided via a connector that carries a probe which extends within the end cavity. The input cavity supports a propagation therethrough of signals within a pass band of frequencies and within a parasitic band of frequencies. The diameter of the end cavity is smaller than the diameter of the input cavity, thereby causing the end cavity to suppress signals within the parasitic band.

8 Claims, 6 Drawing Figures

DUAL MODE FILTER

BACKGROUND OF THE INVENTION

1. Field of Invention

This invention relates to a microwave filter and more particularly to a dual mode filter.

2. Description of the Prior Art

A man made satellite in an orbit about the earth usually has a payload that either serves as a communication relay station or provides data related to weather conditions on the earth. Launching the satellite into the orbit may be difficult and expensive when either the size or the weight of the payload becomes excessive. Therefore, it is desirable to make the payload as small and as light as possible.

The payload may include a transponder that transmits a modulated signal at a frequency within one of twelve signal channels in response to a signal received from a ground station. The signal channels are defined by pass bands of twelve dual mode filters that are included in the transponder. The pass bands may be within a broad band that typically extends from 3.7 GHz to 4.2 GHz, each of the pass bands having a 40 MHz bandwidth.

A dual mode filter is usually comprised of a circular waveguide formed of a cylinder having one or more coaxial cylindrical cavities in tandem, each supporting a pair of $TE_{11}$ modes of propagation therethrough of electromagnetic energy. Usually, if not always, a metal enclosure, known as a coaxial transition assembly, is connected to the end cavity of the dual mode filter via a coupling obstacle. The output of the dual mode filter is provided via a connector mounted upon the coaxial transition assembly. The transition assembly is undesirable because of its size and weight.

In the transponder referred to above, the twelve filters have inputs connected to a known arrangement of rectangular waveguides, referred to herein as a signal manifold system. Signals associated with all of the signal channels are applied to the filter inputs via the manifold system. Terminal conditions at the filter inputs, caused by the rectangular waveguides of the manifold system, usually result in the twelve filters supporting a mode of propagation within a parasitic band (typically two MHz wide). The parasitic band is separated from the upper frequency of the broad band by a small spectrum of frequencies, determined by the diameters of the cavities of the dual mode filters, such spectral separation typically being on the order of 35 MHz. Therefore, the manifold system may cause undesired signals in the parasitic band to pass to the outputs of the twelve filters.

A low pass filter may be connected to the manifold system to prevent parasitic signals from being applied to the filter inputs. However, because the broad band and the parasitic band have the small spectral separation, the low pass filter degrades signals within pass bands of some of the twelve filters.

There is a need, thus, for a band pass filter that is small, light and does not pass parasitic signals.

DETAILED DESCRIPTION

Figure 1:
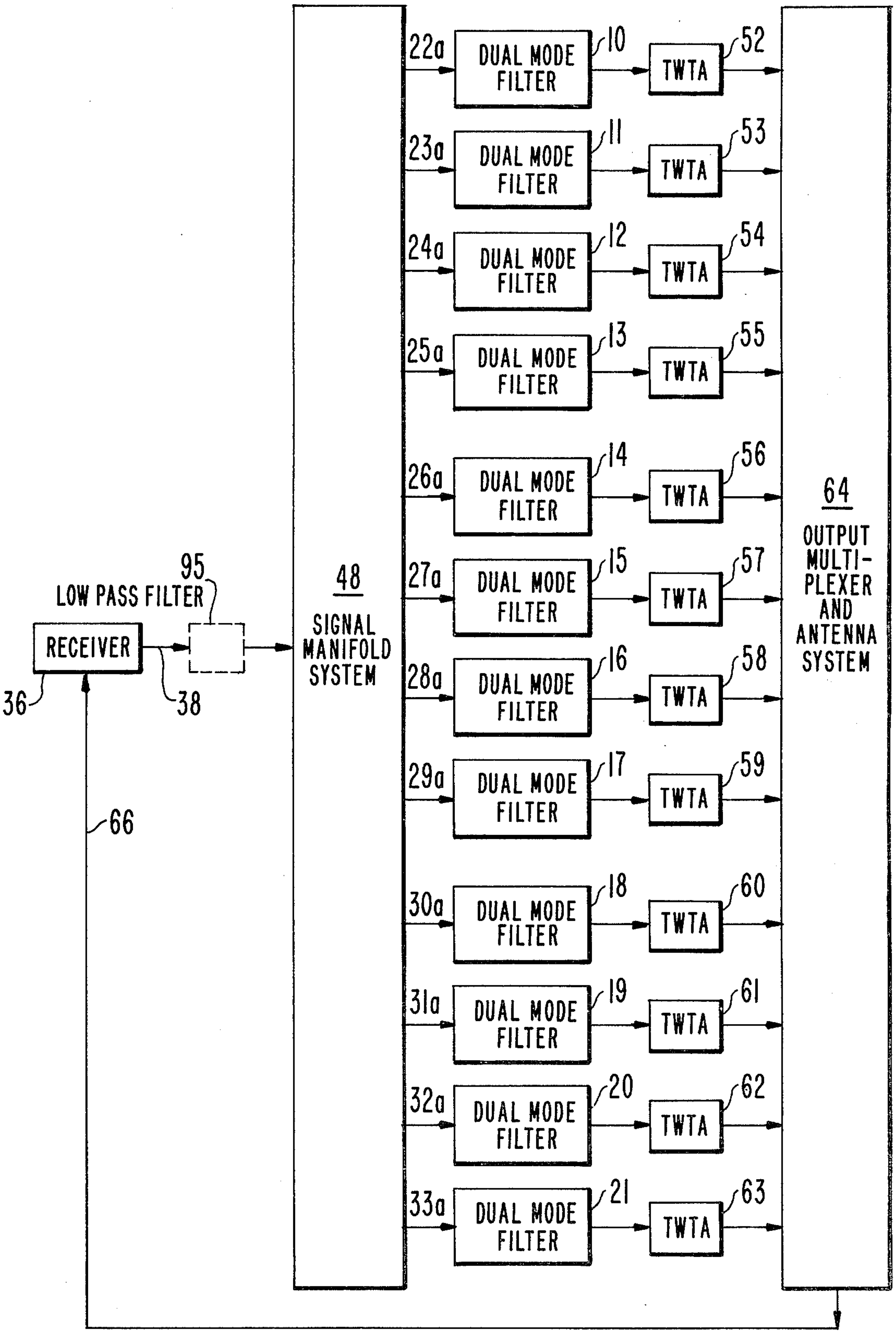
FIG. 1 is a block diagram of a transponder in accordance with a preferred embodiment of the present invention.
Figure 2:
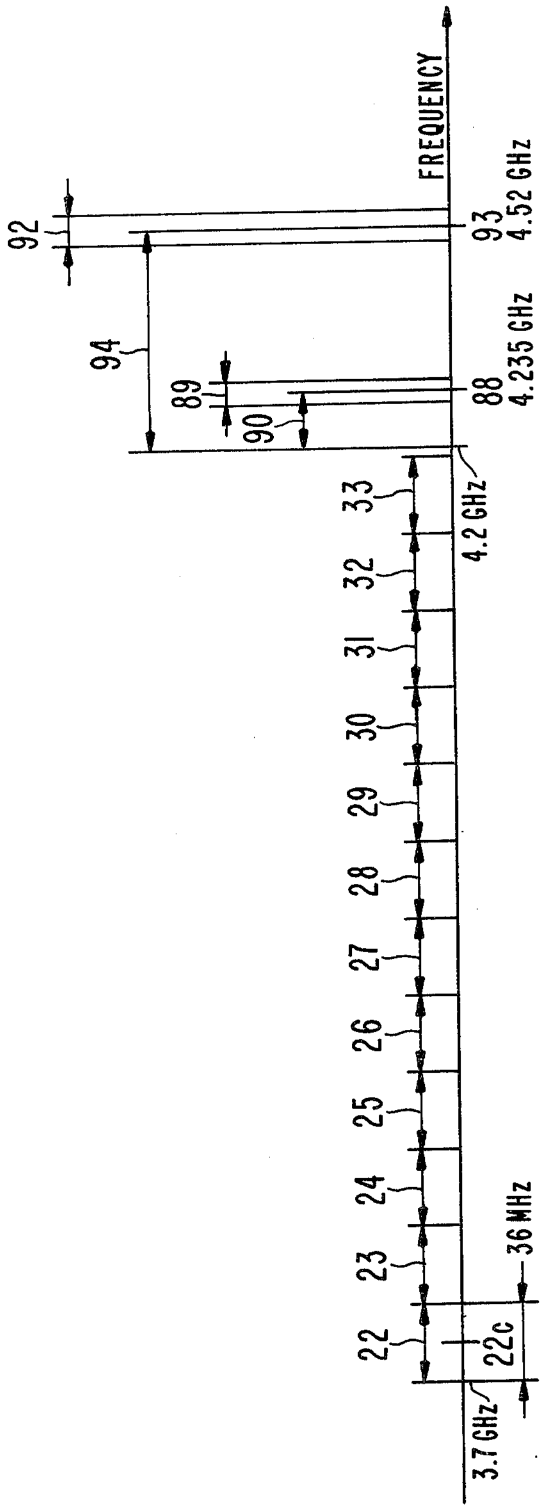
FIG. 2 is a graphic representation of signal channels associated with the transponder of FIG. 1.

As shown in FIG. 1, a transponder includes dual mode filters 10–21 which are all of generally similar construction. As shown in FIG. 2, filters 10–21 have pass bands 22–33, respectively, within a broad band that extends from 3.7 GHz to 4.2 GHz, with a guard band of approximately 4 MHz between adjacent channels (not shown). Additionally, each of pass bands 22–33 has a 36 MHz bandwidth. The outputs of filters 10–21 are connected to the respective inputs of travelling wave tube (TWT) amplifiers 52–63, (FIG. 1). Therefore, for each one of the filters 10–21 there is a corresponding TWT amplifier. Inputs of filters 10–21 are connected to a signal manifold system 48 through signal lines 22*a*–33*a*, respectively.

Manifold system 48 (FIG. 1) is a suitable arrangement of conventional rectangular waveguides that has an input connected to the output of a broad band receiver 36 through signal path 38. As explained hereinafter, receiver 36 provides a signal to filters 10–21 via manifold system 48.

The outputs of amplifiers 52–63 are coupled to an output multiplexer and antenna system 64. System 64 is coupled to receiver 36 through signal path 66, whereby a signal received by system 64 is provided to receiver 36. In response to the received signal, receiver 36 provides a signal within one of the pass bands 22–33 (FIG. 2) that is passed through one of the filters 10–21 to a corresponding one of the amplifiers 52–63. The corresponding one of the amplifiers 52–63, such as amplifier 52, provides an amplified signal to system 64 for radiating electromagnetic energy corresponding to the amplifier signal.

Figure 3:
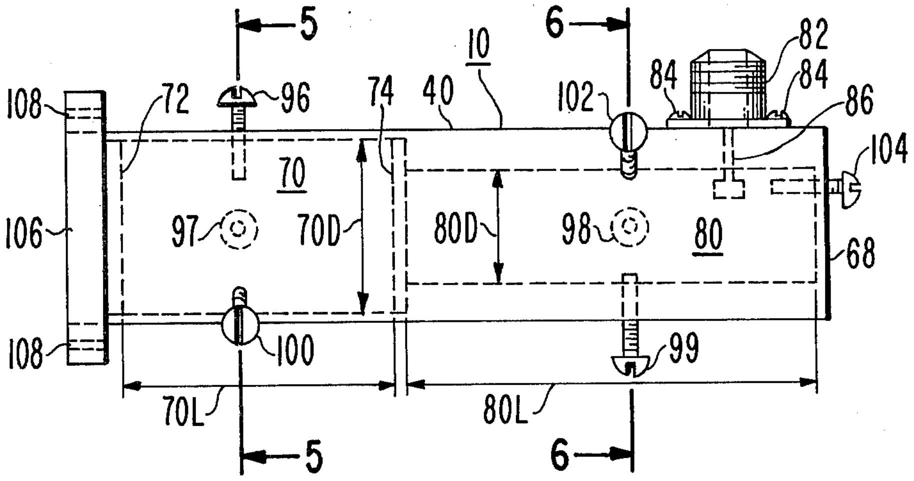
FIG. 3 is a side elevation of a dual mode filter in the transponder of FIG. 1.
Figure 4:
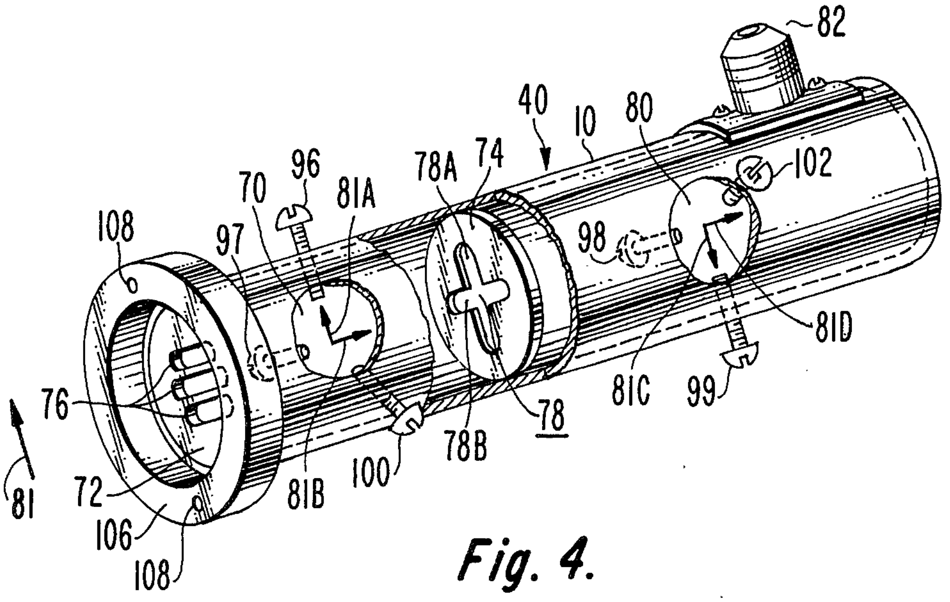
FIG. 4 is a perspective view, with parts broken away, of the dual mode filter of FIG. 3.

As shown in FIGS. 3 and 4, filter 10 is a circular waveguide formed of a cylinder with a disc shaped end wall 68. Within filter 10 is a concentric cylindrical input cavity 70 between disc shaped metal coupling obstacles 72 and 74 that have slots 76 and 78, respectively, therethrough. Additionally, a cylindrical end cavity 80, coaxial with cavity 70, is between obstacle 70 and end wall 68. Cavity 80 may be of the same diameter as cavity 70, but is preferably smaller, as explained hereinafter.

Slot 78 is a cruciform comprised of intersecting slots 78A and 78B. Slots 76, however, are all parallel to slot 78A. Because of the contour and number of slots 76 and 78, pass band 22 has the 36 MHz bandwidth. Since coupling obstacles with slots therethrough are well known in the microwave art, no further details are considered necessary for this description.

Cavities 70 and 80 each support a pair of dominant $TE_{11}$ modes of propagation of electromagnetic energy at frequencies within pass band 22. Thus, filter 10 is conceptionally similar to a low pass prototype filter having four storage elements; two storage elements are associated with cavity 70 and two storage elements are associated with cavity 80. Because four storage elements are associated with cavities 70 and 80, filter 10 is a fourth order filter.

When the input to filter 10 is represented by a field vector 81, the dominant modes within cavity 70 are represented by orthogonal field vectors 81A and 81B; the dominant modes within cavity 80 are represented by orthogonal field vectors 81C and 81D. Moreover, vectors 81B and 81D are parallel to slots 76 and 78B; vectors 81A and 81C are parallel to slot 78A.

In this embodiment, a coaxial connector 82 is connected to filter 10, as by screws 84. Connector 82 carries a generally cylindrical metal probe 86 that extends into cavity 80 with the axis of probe 86 parallel to vectors 81C and 81A (and slot 78A) and orthogonal to the axis of cavity 80. The distance of probe 86 from end wall 68 is approximately one-eighth of the wavelength associated with the center frequency 22c (FIG. 2) of pass band 22.

It should be understood that within cavity 80 an electric field is at a minimum strength at obstacle 74 and at end wall 68. Additionally, the electric field is at a maximum strength approximately midway between obstacle 74 and end wall 68. Probe 86 has a selected length that is inversely proportional to the strength of the electric field where probe 86 is disposed. Therefore, when filter 10 is constructed with probe 86 disposed near either obstacle 74 or end wall 68, probe 86 is preferably relatively long; when filter 10 is constructed with probe 86 disposed midway between obstacle 74 and end wall 68, probe 86 is preferably relatively short. In summary a dual mode filter is provided where the need for a coaxial transition assembly is obviated by a coaxial probe that extends within an end cavity of the dual mode filter.

A well known inherent aspect of a cylindrical cavity is a parasitic mode of propagation of electromagnetic energy, known as the $TM_{010}$ mode, within a parasitic band separated from the broad band. The parasitic band has a center frequency in accordance with a relationship which is given as:

$$F = 0.766c/D \qquad (1)$$

where

F is the center frequency of the parasitic band;

D is the diameter of the cavity; and c is the velocity of light in free space.

The rectangular waveguides of manifold system 48 cause cavities 70 and 80 to support propagation of electromagnetic energy within a parasitic band. It should be understood, as indicated above, that the parasitic band has a bandwidth much less than the 36 MHz bandwidth of each of the pass bands 22–33, viz., about two MHz.

According to this embodiment, diameter 70D equals 5.49 cm. In accordance with relationship (1), when diameter 70D equals 5.49 cm, cavity 70 supports a mode of propagation within a parasitic band 89, of about two MHz, that has a center frequency 88 (FIG. 2) equal to 4.235 GHz. Therefore, parasitic band 89 and the broad band have a spectral separation 90 which is 35 MHz above the highest frequency of the broad band, viz., 4.2 GHz. A low pass filter could be connected to manifold system 48 (FIG. 1) to reject signals within parasitic band 89. However, since a spectral separation of 35 MHz is small, such a low pass filter would degrade signals within some of the pass bands 22–33.

In further accord with this embodiment, diameter 80D (FIG. 3) equals 5.08 cm. In accordance with relationship (1), when diameter 80D equals 5.08 cm, cavity 80 supports a mode of propagation within a parasitic band 92, also of about two MHz bandwidth, that has a center frequency 93 (FIG. 2) equal to 4.52 GHz. Thus, parasitic band 92 and the broad band have a spectral separation 94 that equals 320 MHz, which is large as compared to spectral separation 90. Thus, a low pass filter 95 of any suitable type may be coupled into path 38 to reject signals within parasitic band 92 without degrading signals within pass bands 22–33. Moreover, since cavity 80 does not support a mode of propagation of electromagnetic energy within the parasitic band 92, cavity 80 rejects parasitic energy that may be transmitted thereto from cavity 70. Accordingly, signals within the parasitic band 92 are not transmitted to the output of filter 10; they are therefore suppressed.

The center frequency (e.g., 22c of FIG. 2) of filter 10 is substantially determined by axial lengths 70L and 80L of cavities 70 and 80, respectively. Lengths 70L and 80L both are nominally equal to one half of the wavelength associated with center frequency 22c. Since, diameter 80D of cavity 80 is less than diameter 70D of cavity 70, one half of the wavelength of signals associated with frequency 22c in cavity 80 is longer than one half of the wavelength of the signals associated with frequency 22c in cavity 70. Accordingly length 80L is longer than length 70L.

It should be understood that when energy is propagated through filter 10, there are ohmic insertion losses in cavities 70 and 80 that are inversely related to diameters 70D and 80D, respectively. Because diameter 80D is less than diameter 70D, the insertion loss within cavity 80 is greater than the insertion loss within cavity 70. Since cavity 80 is longer and the insertion loss therein greater, when a dual mode filter of an alternative embodiment has more than two cavities, only an end cavity is provided with a diameter that suppresses parasitic signals transmitted thereto from other cavities.

Figure 5:
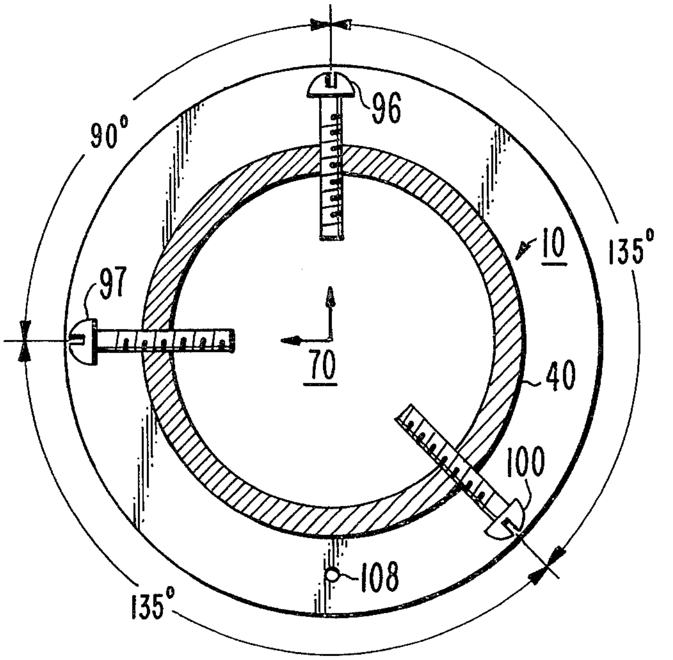
FIG. 5 is a view of FIG. 3 taken along the line 5—5.
Figure 6:
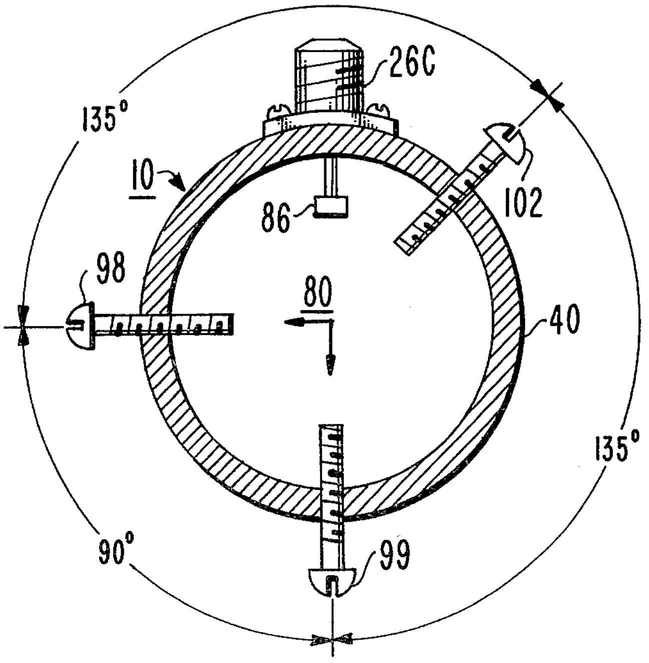
FIG. 6 is a view of FIG. 3 taken along the line 6—6.

As best shown in FIGS. 5 and 6, tuning screws 96, 97, 98, and 99 are maintained within threaded holes through the wall 40 of filter 10. Screws 96 and 97, with an arcuate separation therebetween of ninety degrees, extend within cavity 70. The axes of screws 96 and 97 are parallel to slots 78A and 78B, respectively. Cavity 70 is tuned by axially rotated screws 96 and 97 to change their extent within cavity 70.

Similarly, screws 98 and 99, with an arcuate separation therebetween of ninety degrees, extend within cavity 80. Additionally, screw 99 has an arcuate separation of 180 degrees from screw 96. The axes of screws 98 and 99 are parallel to slots 78B and 78A, respectively. Cavity 80 is tuned by axially rotating screws 98 and 99 to change their extent within cavity 80.

In addition to screws 96–99, coupling screws 100 and 102 are maintained within threaded holes through wall 40. Screws 100 and 102 extend within cavities 70 and 80, respectively. Screw 100 has an arcuate separation of 135° from screw 96 and from screw 97. Similarly, screw 102 has an arcuate separation of 135° from screw 98 and from screw 99. The coupling of the dominant modes within cavities 70 and 80 is adjusted by axially rotating screws 100 and 102 to change their extent within cavities 70 and 80, respectively.

A tuning screw 104 (FIG. 3) is maintained within a threaded hole through end plate 68 to extend within a portion of cavity 80 near probe 86. This portion of cavity 80 is tuned by screw 104 to compensate for the presence of probe 86.

Filter 10 includes a flange 106 (FIGS. 3 and 4) adjacent obstacle 72. Flange 106 has passing therethrough holes 108 that receive mounting bolts (not shown) for suitably fastening filter 10 to manifold system 48 (FIG. 1).

A dual mode filter of one alternative embodiment may include one end cavity, similar to cavity 80, and a plurality of cavities in tandem that are each similar to cavity 70. The cavities are separated from each other by coupling obstacles, having a slot 78, similar to that provided in obstacle 74. A dual mode filter of another alternative embodiment may include a plurality of cavities with the diameter of one cavity, other than an end cavity, less than the diameter of all others of the plurality of cavities.

Since a cavity of a dual mode filter supports two dominant $TE_{11}$ modes of propagation, a dual mode filter of any embodiment is of an order equal to twice the number of cavities therein. A dual mode filter with four sections, for example, is an eighth order dual mode filter.

As described hereinbefore, the output of a dual mode filter is provided via a coaxial probe that extends within an end cavity of the dual mode filter, thereby obviating a need for a coaxial transition assembly. Further, twelve dual mode filters are included in a transponder to provide twelve pass bands within a broad band of frequencies. The twelve dual mode filters each have an end section with a diameter that causes a suppression of undesired signals that would otherwise be passed within a parasitic band having a small spectral separation from the braod band. The end section causes undesired signals to be passed within a more remote and thus, easily filterable parasitic band.

What is claimed is:

1. A dual mode filter comprising:

a circular waveguide having one end adapted for connection to a signal source;

a first coupling obstacle connected to said one end;

a second coupling obstacle connected within said waveguide between said first coupling obstacle and the other end of said waveguide, thereby forming coaxial input and end cavities between said coupling obstacles and between said second coupling obstacle and said other end, respectively, said cavities being of unequal diameter with lengths of said cavities being substantially equal to one half of a wavelength associated with a center frequency of a pass band of said filter;

an end wall connected to said other end; and means for coupling a signal from said end cavity;

the diameter of said end cavity being less than that of said input cavity so that the insertion loss of said end cavity is greater than the insertion loss of said input cavity whereby parasitic signals are suppressed only in said end cavity.

2. A dual mode filter comprising:

a circular waveguide having one end adapted for connection to a signal source;

a first coupling obstacle connected to said one end;

a second coupling obstacle connected within said waveguide between said first coupling obstacle and the other end of said waveguide thereby forming coaxial input and end cavities between said coupling obstacles and between said second coupling obstacle and said other end, respectively;

an end wall with a threaded hole therethrough connected to said other end;

a coaxial connector that is fixedly mounted upon said waveguide;

a generally cylindrical probe, carried by said connector, that extends within said end cavity; and a tuning screw moveably mounted within said threaded hole, said tuning screw extending within said end cavity to a distance from said probe selected to cause said tuning screw to compensate for the presence of said probe within said end cavity.

3. The filter of claim 2 wherein said second coupling obstacle includes a pair of slots therethrough that intersect to form a cruciform, the axis of said probe being parallel to one of said slots and perpendicular to the axis of said cavities.

4. The filter of claim 2 wherein said cavities are of unequal diameter, lengths of said cavities being substantially equal to one half of a wavelength associated with a center frequency of a pass band of said filter.

5. In a dual mode filter of a type that includes a circular waveguide wherein coaxial cylindrical input and end cavities are between first and second coupling obstacles and between said second coupling obstacles and an end wall, respectively, both of said cavities supporting a pair of dominant $TE_{11}$ modes of propagation therethrough of electromagnetic energy within a pass band of frequencies, the improvement comprising:

a coaxial connector mounted upon said waveguide;

a generally cylindrical probe connected to said connector that extends within said end cavity; and a tuning screw that is moveably mounted within a threaded hole through said end wall, said tuning screw extending within said end cavity to a distance from said probe selected to cause said tuning screw to compensate for the presence of said probe within said end cavity.

6. The filter of claim 5 wherein said second coupling obstacle includes a pair of slots therethrough that intersect to form a cruciform, the axis of said probe being parallel to one of said slots and perpendicular to the axis of said end cavity.

7. The filter of claim 5 wherein said cavities are of unequal diameter, lengths of said cavities being substantially equal to one half of a wavelength associated with a center frequency of a pass band of said filter.

8. In a transponder wherein a signal from a receiver is provided via a signal manifold to a dual mode filter that includes a circular waveguide wherein an input cavity is between first and second fixedly disposed coupling obstacles that are separated by a distance substantially equal to one half of the wavelength associated with a center frequency of a pass band of said filter, said input cavity supporting a pair of dominant $TE_{11}$ modes of propagation therethrough of electromagnetic energy within said pass band, the improvement comprising:

an end wall of said waveguide separated from said second coupling obstacle by a distance substantially equal to one half of said wavelength, thereby providing a cylindrical end cavity within said waveguide between said end wall and said second coupling obstacle, said end cavity having a diameter different from the diameter of said input cavity; and means connected to said waveguide for coupling a signal from said end cavity;

the diameter of said end cavity being less than that of said input cavity so that the insertion loss of said end cavity is greater than the insertion loss of said input cavity whereby parasitic signals are suppressed only in said end cavity.

* * * * *

UNITED STATES PATENT AND TRADEMARK OFFICE
CERTIFICATE OF CORRECTION

PATENT NO. : 4,135,133

DATED : January 16, 1979

INVENTOR(S) : Chuck Kng Mok

It is certified that error appears in the above-identified patent and that said Letters Patent is hereby corrected as shown below:

Title Page, change "[73] Assignee: RCA Corporation, New York, N.Y." to --[73] Assignee: RCA Limited, Quebec, Canada--

Signed and Sealed this

***Twenty-seventh* Day of *November 1979***

[SEAL]

*Attest:*

RUTH C. MASON
*Attesting Officer*

LUTRELLE F. PARKER
*Acting Commissioner of Patents and Trademarks*